(12) United States Patent
Lee et al.

(10) Patent No.: US 6,696,769 B2
(45) Date of Patent: Feb. 24, 2004

(54) MODE SWITCH ASSEMBLY OF AUTOMOBILE HAVING IMPACT/LOAD ABSORBING APPARATUS

(75) Inventors: Jeong-yeop Lee, Daejon (KR); Tae-soo Chun, Daejon (KR); Seung-hyung Yun, Daejon (KR)

(73) Assignee: Halla Climate Control Corporation, Daejon (KR)

( * ) Notice: Subject to any disclaimer, the term of this patent is extended or adjusted under 35 U.S.C. 154(b) by 119 days.

(21) Appl. No.: 10/114,437

(22) Filed: Apr. 3, 2002

(65) Prior Publication Data

US 2002/0145337 A1 Oct. 10, 2002

(30) Foreign Application Priority Data

Apr. 4, 2001 (KR) ......................................... 2001-17914
Dec. 28, 2001 (KR) ......................................... 2001-86737

(51) Int. Cl.⁷ .......................... H01H 3/08; H01H 9/02; B60R 21/09
(52) U.S. Cl. ...................... 307/10.1; 280/751; 200/300; 248/548; 296/189; 16/441
(58) Field of Search ........................ 307/10.1; 280/751; 381/109; 296/37.12, 1.04, 189; 200/300; 180/271; 248/548; 16/441

(56) References Cited

U.S. PATENT DOCUMENTS

| | | | | |
|---|---|---|---|---|
| 4,534,240 A | * | 8/1985 | Dietz et al. | 74/545 |
| 4,903,987 A | * | 2/1990 | Stokes | 280/752 |
| 5,111,620 A | * | 5/1992 | Lau et al. | 296/187.05 |
| 5,235,648 A | * | 8/1993 | Yamamoto | 248/548 |
| 5,306,884 A | * | 4/1994 | Caserta et al. | 200/330 |
| 5,826,907 A | * | 10/1998 | Saito et al. | 280/751 |
| 5,922,261 A | * | 7/1999 | Ford, Jr. | 264/122 |
| 6,073,312 A | * | 6/2000 | Dao et al. | 16/441 |
| 6,512,189 B1 | * | 1/2003 | Schuberth et al. | 200/334 |
| 6,598,365 B2 | * | 7/2003 | Abraham et al. | 267/160 |

FOREIGN PATENT DOCUMENTS

| | | | | |
|---|---|---|---|---|
| EP | 1248274 A2 | * | 4/2002 | H01H/3/08 |
| JP | 6-36168 | | 2/1994 | |
| JP | 7-210250 | | 8/1995 | |
| JP | 8-138480 | | 5/1996 | |
| JP | 10-021782 | * | 1/1998 | H01H/13/14 |
| JP | 10-058999 | * | 3/1998 | B60K/20/02 |
| JP | 2003-011744 | * | 1/2003 | H01H/9/00 |
| JP | 2003-040039 | * | 2/2003 | B60R/7/06 |

* cited by examiner

*Primary Examiner*—Brian Sircus
*Assistant Examiner*—Roberto J Rios
(74) *Attorney, Agent, or Firm*—Lowe Hauptman Gilman & Berner LLP

(57) ABSTRACT

A mode switch assembly of an automobile having an impact/load absorbing apparatus includes a housing disposed in a center facia panel in an automobile, a circuit board installed in the housing, on which a switch having a shaft is installed, a support portion for supporting the circuit board a distance from the housing, a knob on the shaft and protruding from the center facia panel, and an impact/load absorbing unit so the knob and the shaft retract with respect to the center facia panel, breaking at least one side of the circuit board or the housing, when an impact/load is applied to the shaft through the knob.

20 Claims, 12 Drawing Sheets

MODE SWITCH ASSEMBLY OF AUTOMOBILE HAVING IMPACT/LOAD ABSORBING APPARATUS

BACKGROUND OF THE INVENTION

1. Field of the Invention

The present invention relates to a mode switch assembly of an automobile, and more particularly to a mode switch assembly having an impact/load absorbing apparatus of an automobile for absorbing an impact/load applied to a knob of a mode switch assembly to manipulate a mode of an air conditioning apparatus in an automobile and overcoming a restriction on the height of a knob protruding from a center facia panel.

2. Description of the Related Art

In general, an internal controlling apparatus having air nozzles and a plurality of mode switches for operating a radio and an air conditioning apparatus is installed at a center facia panel installed at the central portion of a dash board of an automobile. A variety of knobs for manipulating the internal controlling apparatus are installed at the mode switches.

The knobs protrude from the surface of the center facia panel and the heights of the knobs protruding form the surface of the center facia panel are regulated by laws for the safety of a passenger in automobile accidents.

Thus, the knobs of most mode switches installed at the internal controlling apparatus are designed not to protrude above a regulated height. However, in the case of knobs or protrusions protruding over a predetermined height for the convenience of manipulation for a passenger, when an impact/load of a predetermined amount (38.5 kgf) is applied by a passenger in an automobile accident, the knobs or protrusions are designed to absorb the impact/load by being pushed into the center facia panel to protect the passenger.

FIG. 1 is a view showing the state in which mode switches installed at the center facia panel. FIG. 2 is a sectional view showing a conventional impact/load absorbing apparatus of a knob protruding over a predetermined height from the surface of the center facia panel.

Referring to the drawings, a knob impact/load absorbing apparatus for a mode switch of an automobile includes a housing inserted into a center facia panel 100 of an automobile and fixed to the center facia panel 100, and a shaft 2 installed at the housing 1, capable of rotating and sliding in the lengthwise direction. A knob 3 protruding from the center facia panel 100 is installed at one end portion of the shaft 2. The shaft 2 is elastically biased toward the knob 3 by a buffer spring 4 installed in the housing 1.

When an impact/load is applied to the knob 3 by a passenger in an automobile accident, the impact/load absorbing apparatus of a mode switch having the above structure protects a passenger from injury by absorbing the impact/load as the buffer spring 4 is compressed.

However, the impact/load absorbing apparatus for a mode switch of an automobile generates noise during rotation of the shaft 2 since the shaft 2 is elastically supported by the buffer spring 4. Also, there are lots of restrictions in designing the mode switch.

Japanese Patent Publication No. Hei 7-201250 discloses a switch having an impact/load absorbing mechanism attached thereto. The switch with an impact/load absorbing mechanism includes a printed board to which a tact switch is attached. Since the printed board is elastically supported at a base by springs, an impact/load applied during manipulation of the tact switch is absorbed by retracting of the printed board.

Japanese Patent Publication Nos. 2000-222974 and Hei 8-138480 disclose switches for impact/load absorption. In Japanese Patent Publication No. 8-138480 discloses a switch in which elastic poles are installed in the lengthwise direction of a shaft for manipulation to absorb an impact/load.

SUMMARY OF THE INVENTION

To solve the above-described problems, it is an object of the present invention to provide a mode switch assembly of an automobile having an impact/load absorbing apparatus which can protect a passenger by absorbing an impact/load applied to a knob by the passenger in an automobile accident.

It is another object of the present invention to provide a mode switch assembly of an automobile having an impact/load absorbing apparatus which can reduce noise generated due to manipulation of the switch, improve a sense of manipulation, and ease design restrictions.

It is yet another object of the present invention to provide a mode switch assembly of an automobile having an impact/load absorbing apparatus which can overcome restrictions according to the height of a knob protruding from the center facia panel.

To achieve the above object, there is provided a mode switch assembly of an automobile having an impact/load absorbing apparatus comprising a housing disposed in a center facia panel in the automobile, a circuit board installed in the housing, in which a switch having a shaft is installed, a support portion for supporting the circuit board to be separated from a predetermined distance from the housing, a knob installed at the shaft to protrude from the center facia panel, and an impact/load absorbing unit for allowing the knob and the shaft to retreat with respect to the center facia panel as part of at least one side of the circuit board or the housing is broken by an impact/load applied to the shaft from the knob.

It is preferred in the present invention that the impact/load absorbing unit has at least one notch so that the circuit board is broken by an impact/load applied from the knob and the shaft.

It is preferred in the present invention that the support portion comprises a plurality of bosses protruding from the housing and a plurality of coupling members fixing the circuit board to the bosses.

It is preferred in the present invention that the impact/load absorbing unit has at least one slot formed at the mounting portion and at least one connection portion to be broken by an impact/load is installed between slots.

To achieve the above object, there is provided a mode switch assembly of an automobile having an impact/load absorbing apparatus comprising a housing disposed in a center facia panel in the automobile, a circuit board installed in the housing, in which a switch having a shaft is installed, a control cover to which the housing is fixed and that the shaft penetrates, on which a mounting portion coupled to the center facia panel is formed, a knob installed at one end portion of the shaft to protrude from the center facia panel, and an impact/load absorbing unit formed at least one side of the control cover and the mounting portion to have the knob retreat with respect to the center facia panel by being broken by an impact/load applied to the knob and the shaft.

It is preferred in the present invention that the impact/load absorbing unit has a plurality of slots for weakening the structure of the housing formed around each of the bosses so that the housing around each of the bosses is broken by an impact/load applied from the knob and the shaft.

To achieve the above object, there is provided a mode switch assembly of an automobile having an impact/load absorbing apparatus comprising a housing disposed in a center facia panel in the automobile, a circuit board installed in the housing, in which a switch having a shaft is installed, a control cover coupled to the center facia panel and that the shaft penetrates, a knob having a hub that has a hole along which the shaft slides by a coupling unit, and an impact/load absorbing unit installed between a bottom surface of the hole formed in the hub and an end portion of the shaft to absorb an impact/load applied to the knob and allowing the knob to retreat along the shaft.

To achieve the above object, there is provided a mode switch assembly of an automobile having an impact/load absorbing apparatus comprising a housing disposed in a center facia panel in the automobile, a circuit board installed in the housing, in which a switch having a shaft is installed, a support portion for supporting the circuit board to be separated a predetermined distance from the housing, a control cover to which the housing is fixed and that the shaft penetrates, on which a mounting portion coupled to the center facia panel is formed, a knob installed at the shaft to protrude from the center facia panel, a first impact/load absorbing unit for allowing the knob and the shaft to retreat with respect to the center facia panel as part of at least one side of the housing or the circuit board is broken by an impact/load applied to the shaft from the knob, and a second impact/load absorbing unit installed at least one side of the control cover and the mounting portion for allowing the knob to retreat with respect to the center facia panel by an impact/load applied to the knob and the shaft.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
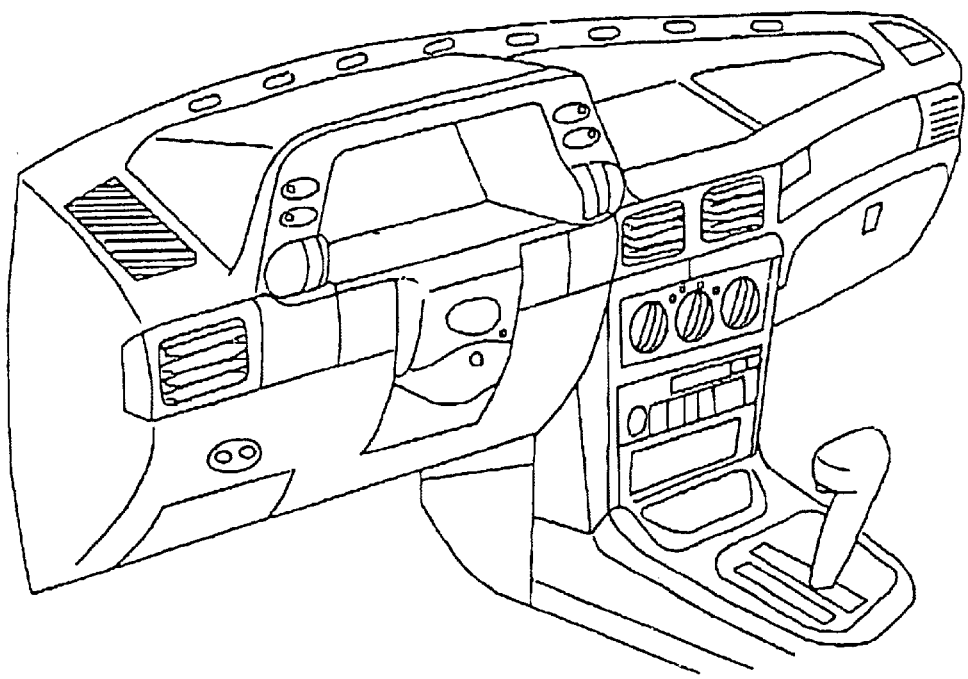
FIG. 1 is a perspective view showing a general center facia panel of an automobile.
Figure 2:
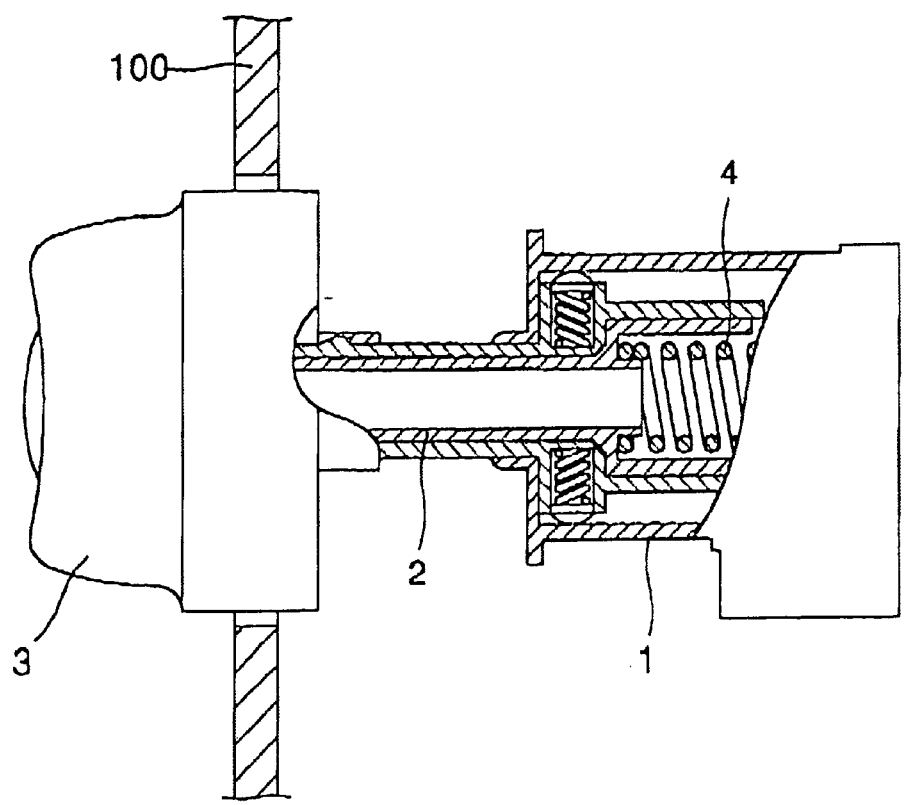
FIG. 2 is a sectional view of a conventional mode switch assembly.

In the following description of preferred embodiments of the present invention, the same reference numerals are used for the same elements having the same functions and redundant portions between preferred embodiments will be omitted for clarity.

A mode switch assembly of an automobile having an impact/load absorbing apparatus according to the present invention is to protect a passenger from a knob protruding from a center facia panel in an automobile accident when there is a need to have the knob of switches for mode manipulation protrude from the center facia panel over a predetermined restricted height. Since the installation of the mode switch assembly of an automobile having an impact/load absorbing apparatus is not limited to a center facia panel, it can be installed at any place in the automobile for example ceiling or door of the automobile.

Figure 3:
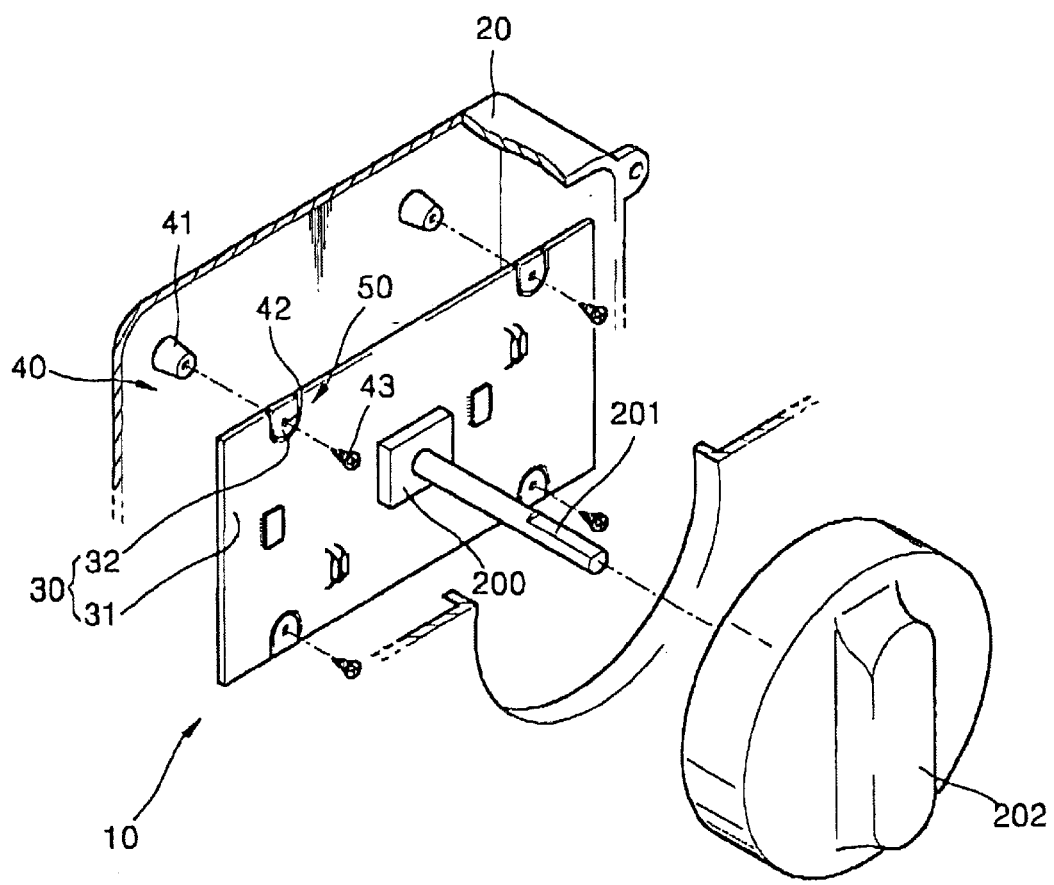
FIG. 3 is an exploded perspective view of a mode switch assembly of an automobile having an impact/load absorbing apparatus according to the present invention.

FIGS. 1 and 3 show a mode switch assembly of an automobile having an impact/load absorbing apparatus according to a preferred embodiment of the present invention.

Referring to the drawings, a mode switch assembly 10 of an automobile having an impact/load absorbing apparatus according to the present invention includes a hosing 20 disposed inside a center facia panel 100 inside the automobile, a circuit board 30 installed inside the housing 20 in which a switch 200 having a shaft 201, a support portion 40 for supporting the circuit board 30 to be separated a predetermined distance from the housing 20, and a knob 202 installed at the shaft 201 to protrude from the center facia panel 100. Also, the mode switch assembly 10 includes an impact/load absorbing portion 50 that allows the knob 202 and the shaft 201 to retreat with respect to the center facia panel 100 as part of the circuit board 30 is broken by an impact/load applied to the shaft 201 from the knob 202.

The support portion 40 for supporting the circuit board 30 with respect to the housing 20 fixes the circuit board 30 to the housing 20. The support portion 40 includes a plurality of bosses 41 protruding from the inner side of the housing 20 to support the circuit board 30 and a plurality of coupling members 43 coupled to the bosses 41 through coupling holes 42 formed in the circuit board 30 to fix the circuit board 30 to the bosses 41. Here, the coupling members 43 may be set screws screw-coupled to the bosses 41.

Figure 4:
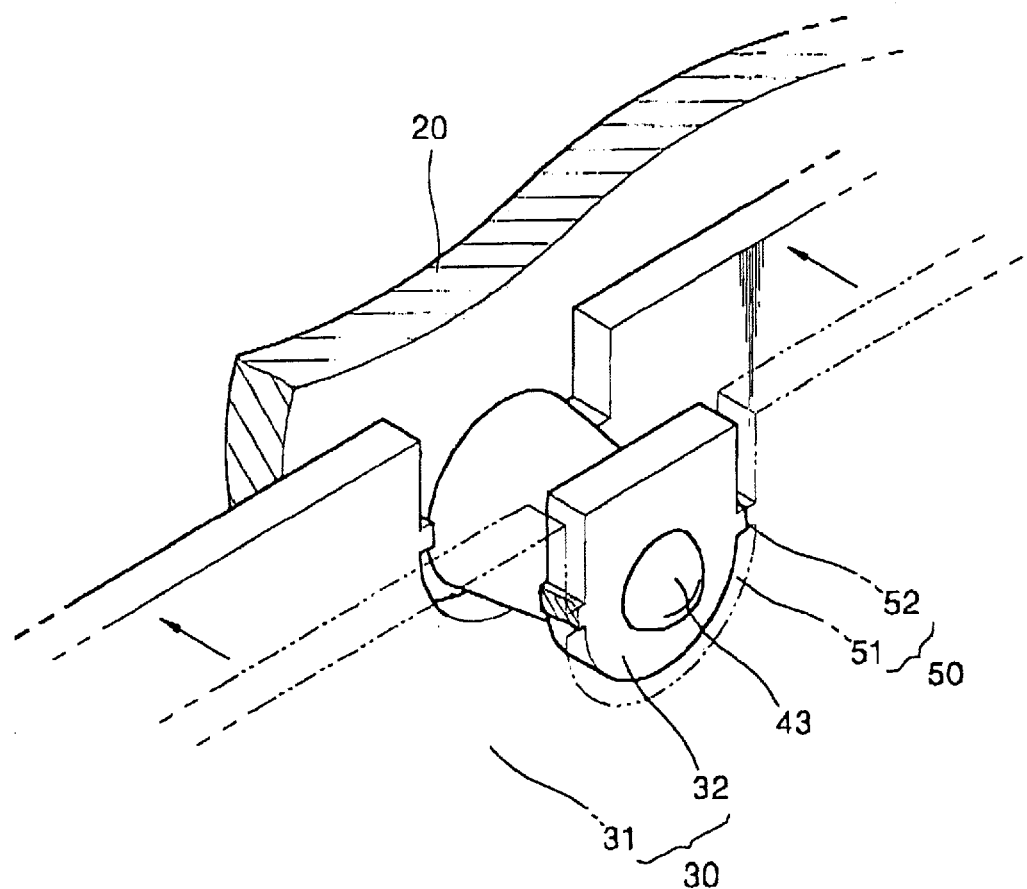
FIG. 4 is a magnified perspective view showing an impact/load absorbing portion of FIG. 3.

The impact/load absorbing portion 50 shown in FIG. 4 allows the knob 202 to be pushed into the center facia panel 100 as part of the circuit board 30 is broken by an impact/load applied in the lengthwise direction of the shaft 201 via the knob 202 and the shaft 201.

Referring to the drawing, a plurality of slots 51 formed around each of the coupling holes 42 of the circuit board 30 at a predetermined interval to divide the circuit board 30 into a main body area 31 and a fixing area 32. At least one connection portion 52 connecting the main body area 31 and the fixing area 32 is formed between the slots 51. Here, the size and number of the slots 51 and the connection portion 52 can be designed to satisfy the restriction regulation of an automobile so that the connection portion 52 can be broken by an impact/load applied through the knob 202 and the shaft 201.

Figure 5:
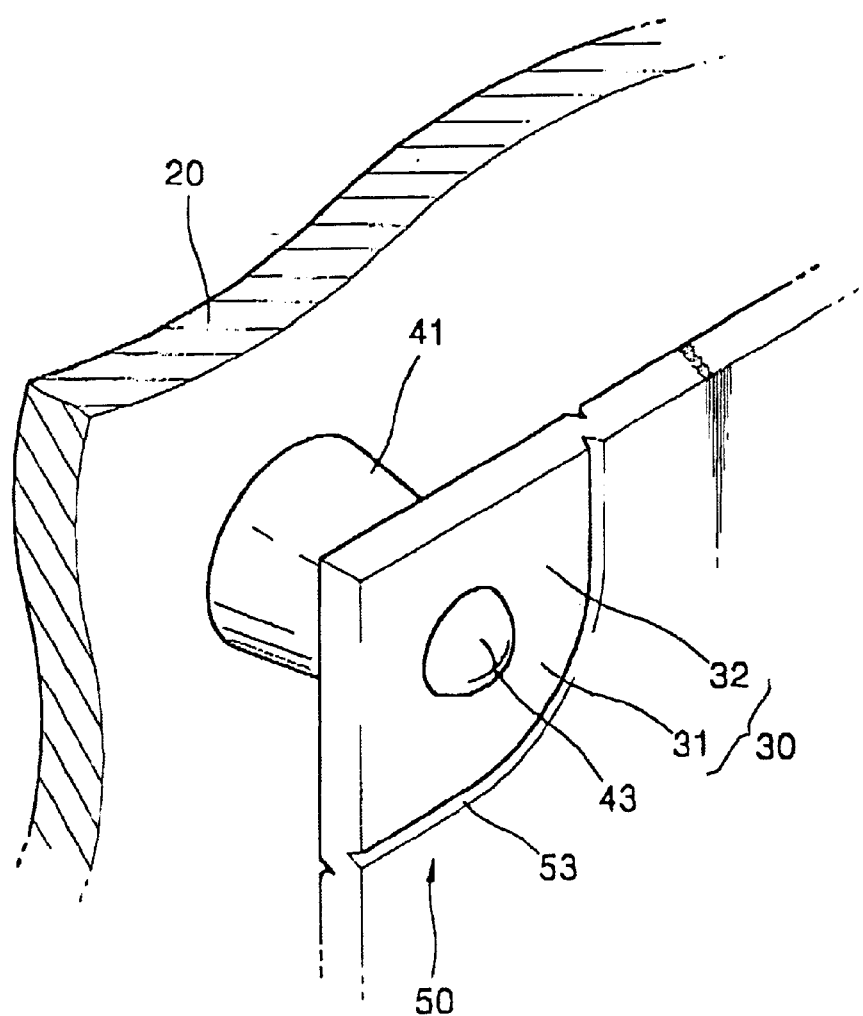
FIGS. 5 through 8 are partially cut-away perspective views showing examples of impact/load absorbing portions according to other preferred embodiments.

Alternatively, the impact/load absorbing portion 50 can be a notch 53 formed between the main body area 31 and the fixing area 32 of the circuit board 30, as shown in FIG. 5. The notch 53 can be a groove(s) continuously or discontinuously formed in the circuit board 30.

Figure 6:
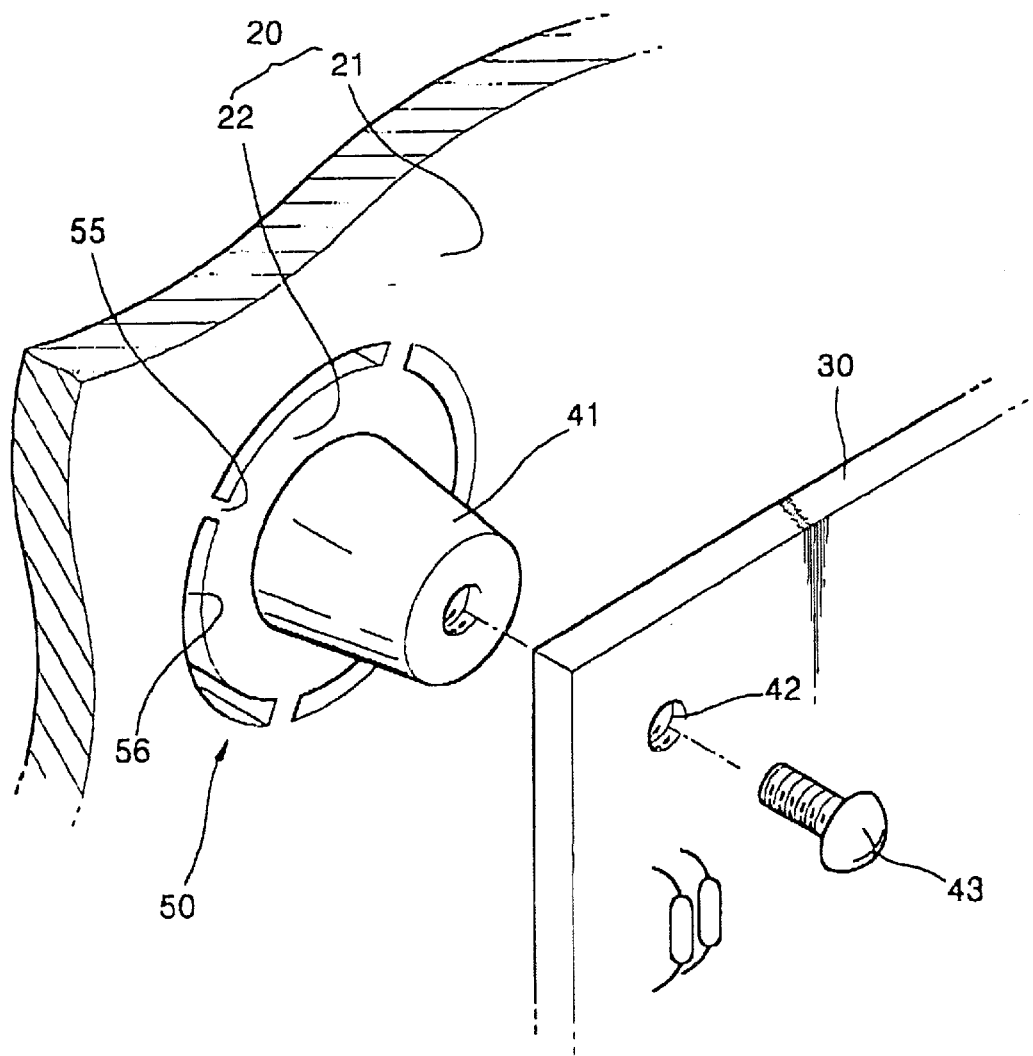

FIG. 6 shows another example of the impact/load absorbing portion 50 in the mode switch assembly of an automobile. The impact/load absorbing portion 50 is formed such that the knob 202 can retreat with respect to the center facia panel 100 by making a portion around the boss 41 of the housing 20 relatively weak so that the portion of the housing 20 can be broken by an impact/load transferred through the knob 202 and the shaft 201. Referring to the drawing, in the impact/load absorbing portion 50, at least one slot 55 is formed in the housing 20 around the boss 41 to thus form a housing main body area 21 and a housing boss area 22. As the slot 55 is formed, the housing main body area 21 and the housing boss area 22 are connected by a connection portion 56.

Figure 7:
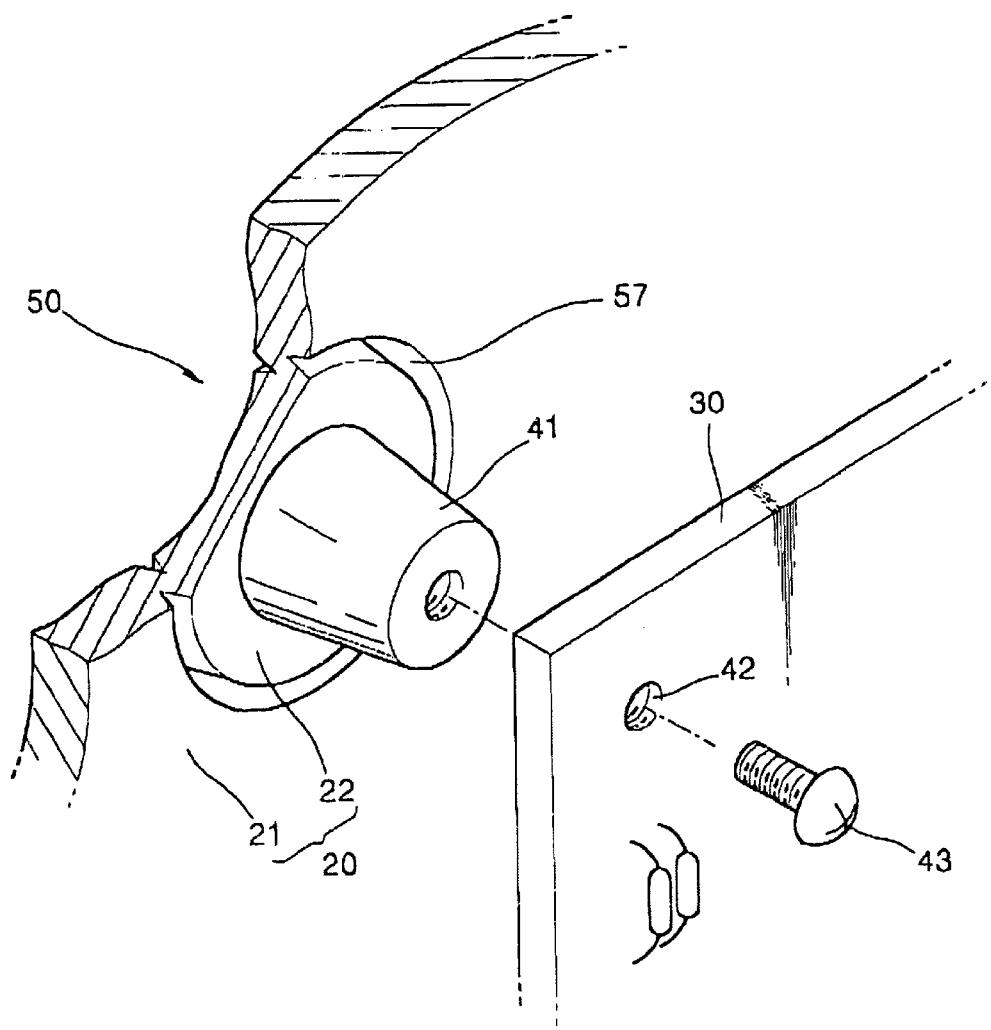
Figure 8:
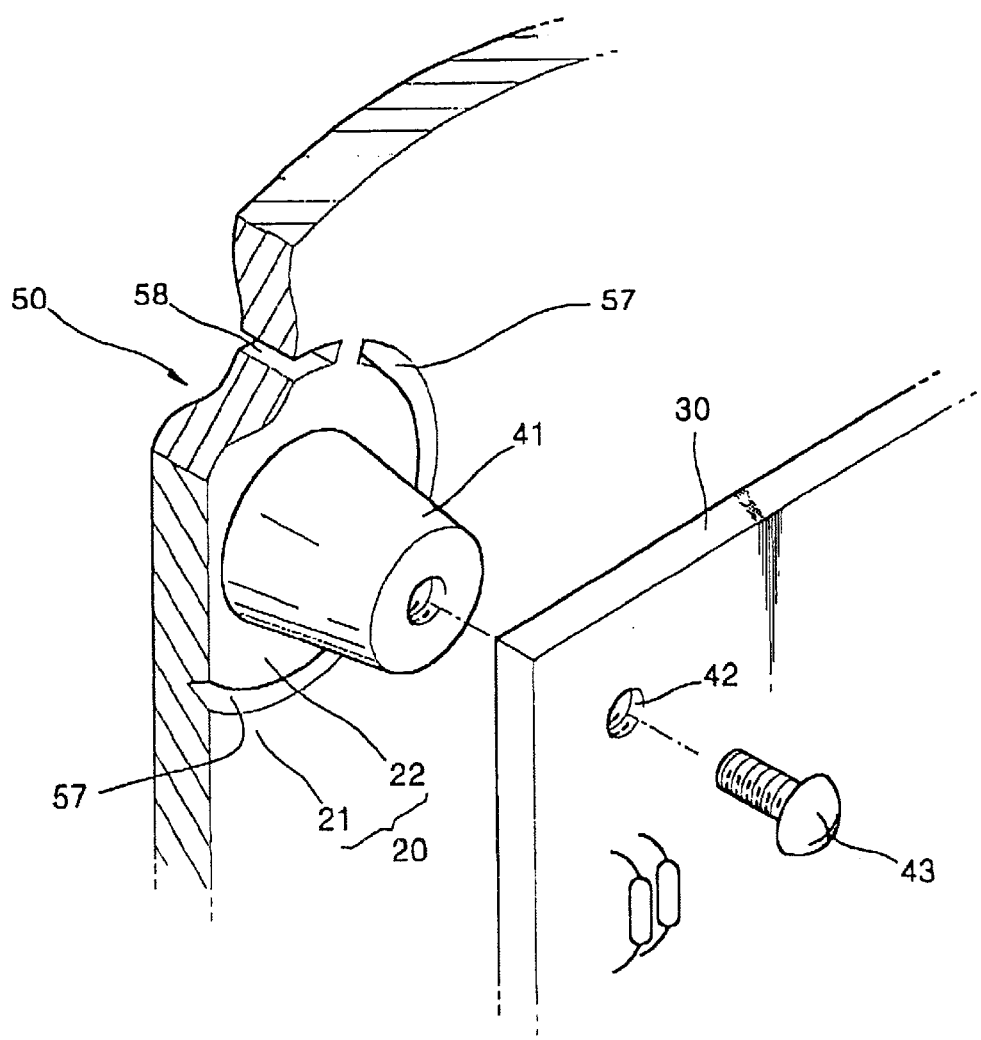

The impact/load absorbing portion 50 formed at the housing 20 may be a notch 57 formed around the boss 41, as shown in FIG. 7. The notch 57 can be formed by a groove(s) continuously or discontinuously formed in the housing 20 around the boss 41. Here, when the notch 57 is formed around the boss 41 of the housing 20, at least one slot 58 is preferably formed at a portion of the housing 20 where the notch 57 is formed, as shown in FIG. 8, so that the housing 20 can be easily broken by an impact/load applied to the boss 41.

The operation of the mode switch assembly of an automobile having an impact/load absorbing apparatus having the above-described structure according to the present invention is described as follows.

In the mode switch assembly of the above-described preferred embodiment, the circuit board 30 is arranged in front of the boss 41 formed on the inner side surface of the housing 20 and fixed to the housing 20 by the coupling member 43. Then, the shaft 201 of the switch 200 installed at the circuit board 30 is arranged to protrude above the center facia panel 100. The knob 202 is coupled to the shaft 201.

In an automobile accident, when an impact/load over a predetermined amount defined by corresponding automobile protrusion restriction regulations is applied by a passenger to the knob 202 protruding above the center facia panel 100, the impact/load is transferred to the circuit board 30 via the shaft 201. The connection portion 52 is broken as a load concentrates on the connection portion 52 which is formed around each of the coupling holes 42 of the circuit board 30 and connects the main body area 31 of the circuit board 30 and the fixing area 32 support by the bosses 41. The circuit board 30 retreats by being separated from the bosses 210.

Then, the knob 202 as well as the shaft 201 is moved together with the circuit board 30 toward the inner side surface of the housing 20. Thus, as the knob 202 is pushed into the center facia penal 100, the impact/load received by a passenger is lowered.

In the meantime, when the slot 55 and the connection portion 56 are formed around the boss 41, as shown in FIG. 6, or the notch 57 is formed as shown in FIGS. 7 and 8, the impact/load applied to the knob 202 an the shaft 201 is transferred to the boss 41 via the circuit board 30. Thus, as a load of the impact/load concentrates on the portion where the connection portion 56 or the notch 57 is formed, which is relatively weak, the connection portion 56 or the notch 57 is broken. As a result, the circuit board 30 in the state of being coupled to the boss 41 is separated from the housing 20 and retreats, so that the knob 202 is pushed into the center facia panel 100 and the impact/load received by the passenger is lowered.

Figure 9:
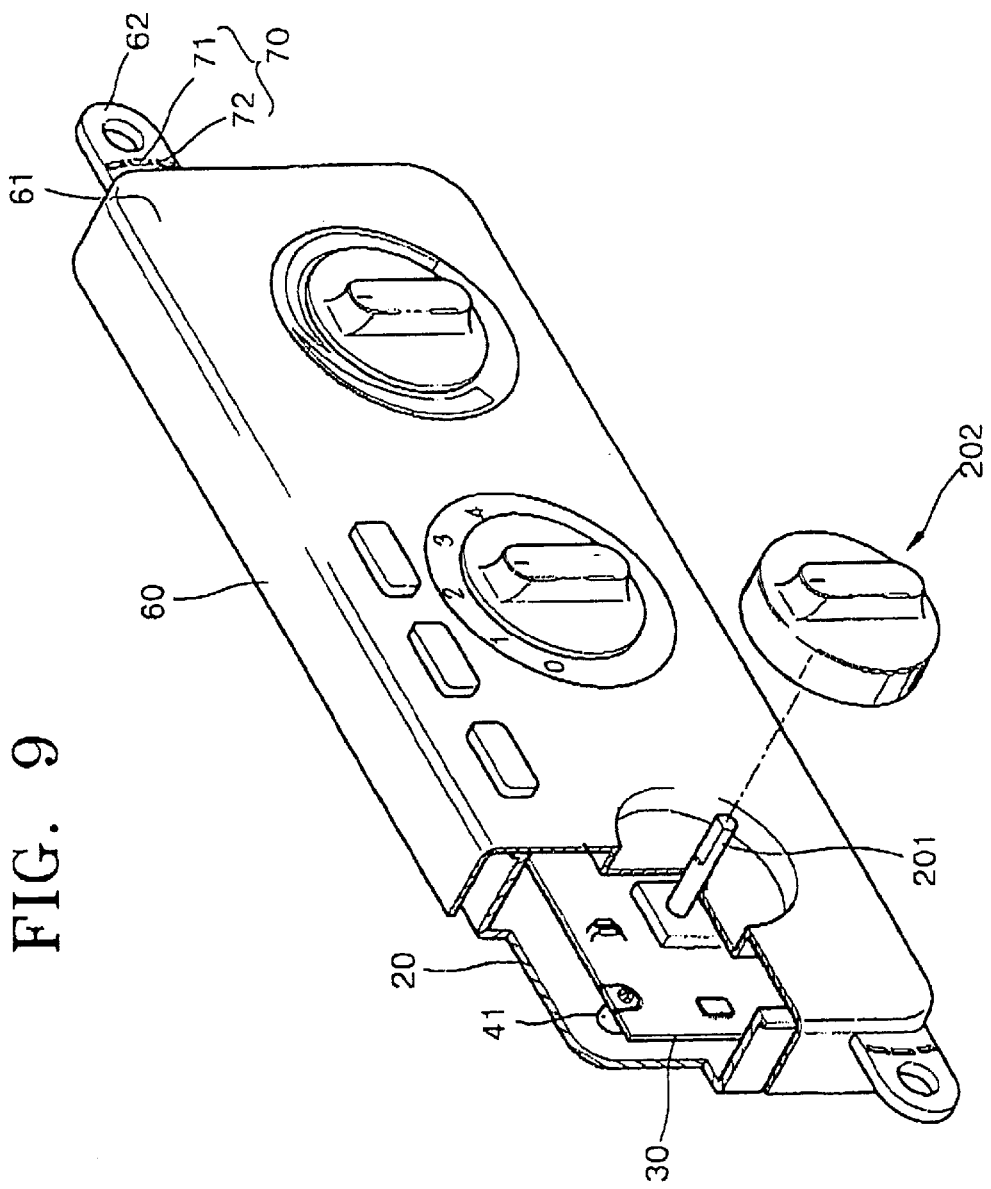
FIG. 9 is a partially cut-away perspective view showing another preferred embodiment of a mode switch assembly of an automobile having the impact/load absorbing apparatus of the present invention.

FIGS. 1 and 9 show another preferred embodiment of a mode switch assembly of an automobile having the impact/load absorbing apparatus of the present invention.

Referring to the drawings, a mode switch assembly according to another preferred embodiment of the present invention includes the housing 20 disposed in the center facia panel 100 inside the automobile, a circuit board 30 installed in the housing 20 where the switch having the shaft 201 is installed, and a control cover 60 fixed to the housing 20 and that the shaft 201 penetrates, in which a mounting portion 61 is formed. The knob 202 is installed at the shaft 201 protruding from the center facia panel 100. An impact/load absorbing portion 70 is formed at least one side of the control cover 60 and the mounting portion 62, so that the knob 202 retreats with respect to the center facia panel 100 by an impact/load applied to the knob 202 and the shaft 201.

Figure 10:
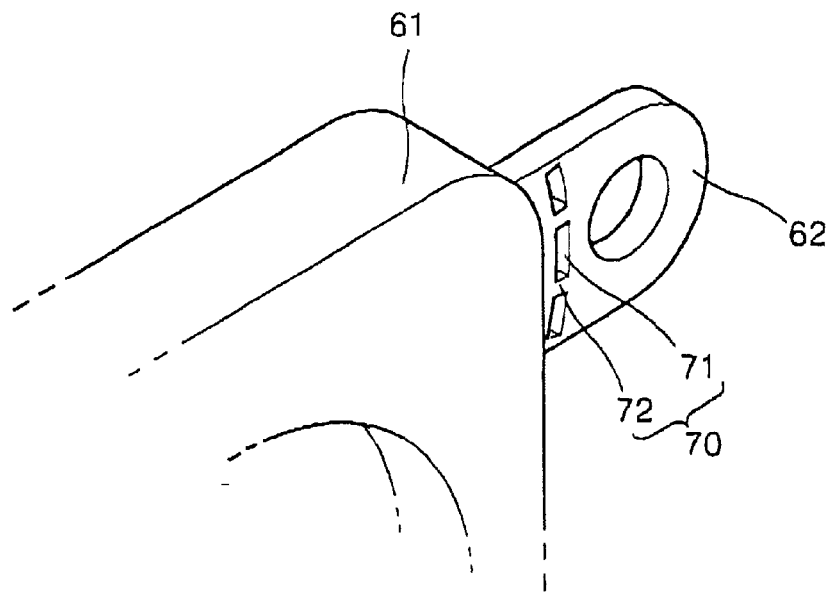
FIG. 10 is a perspective view showing a mounting portion of a control cover shown in FIG. 9.

In the impact/load absorbing portion 70, a plurality of slots 71 are formed in the mounting portion 61 at a predetermined interval and a connection portion 72 to be broken by an impact/load is formed between the slots 71, as shown in FIGS. 9 and 10.

Figure 11:
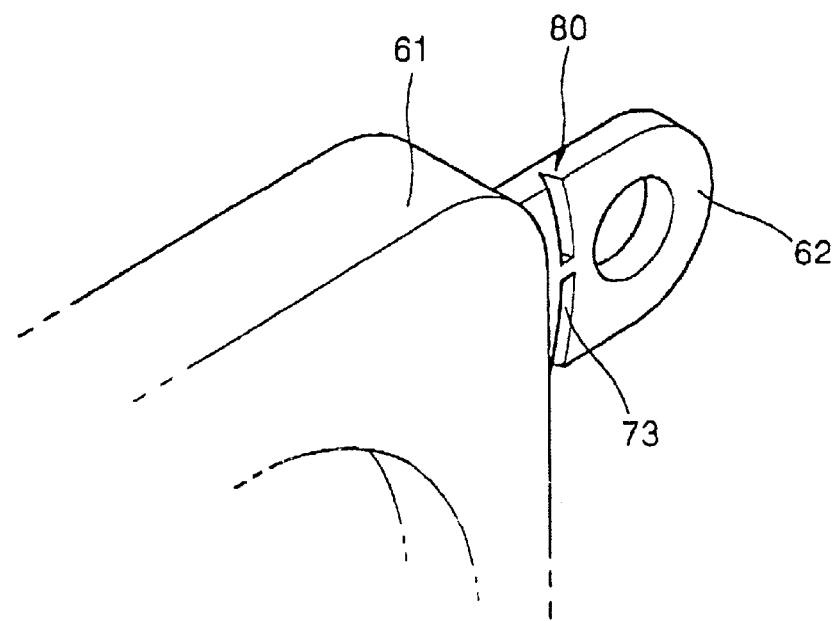
FIG. 11 is a partially cut-away perspective view showing an impact/load absorbing portion according to another preferred embodiment of the present invention.

Another preferred embodiment of an impact/load absorbing portion 80 includes a structurally weak portion at one side of at least one of a main body 61 of the control cover 60 and a mounting portion 62. The weak portion 73 may be a notch (not shown) formed continuously or discontinuously around a portion fixed to the housing 20 in the main body 61 of the control cover 60. The weak portion 73 may be a notch (or groove) 73 formed continuously or discontinuously at a boundary portion between the mounting portion 62 and the main body 61 of the control cover 60, as shown in FIG. 11. Here, both the slot 71 and the notch 73 can be formed in the mounting portion 62.

In the mode switch assembly of an automobile having the above structure according to the above-described preferred embodiment of the present invention, when an impact/load over a predetermined amount is applied to the knob 202, the mounting portion 62 of the control cover 60 is broken or the portion where the control cover 60 is coupled to the housing 20 is broken so that the impact/load is lowered. That is, when an impact/load over a predetermined amount is applied to the knob 202, the impact/load is transferred to the control cover 60 though the shaft 201, the circuit board 30, and the housing 20. Thus, the transferred impact/load concentrates on the connection portion 72 formed at the mounting portion 62 and the connection portion 72 is broken. As a result, the housing 20 and the control cover 60 are separated from the center facia panel 100 and moved inside the center facia panel 100. Consequently, the knob 202 is pushed into the center facia panel 100 with the housing 20 and the control cover 60 so that the impact/load received by the passenger is lowered.

In the structure of alleviating an impact/load by being broken as described in the above preferred embodiments, since electrical/electronic damage to other parts is prevented by the movement to lower an impact/load applied by the knob 202, damage to the related parts is minimized and durability is improved. Also, since the impact/load absorbing apparatus eases the restriction on the impact/load to be taken into consideration at the early stage of design, not only the knob and control cover but also the center facia panel can be freely designed.

Figure 12:
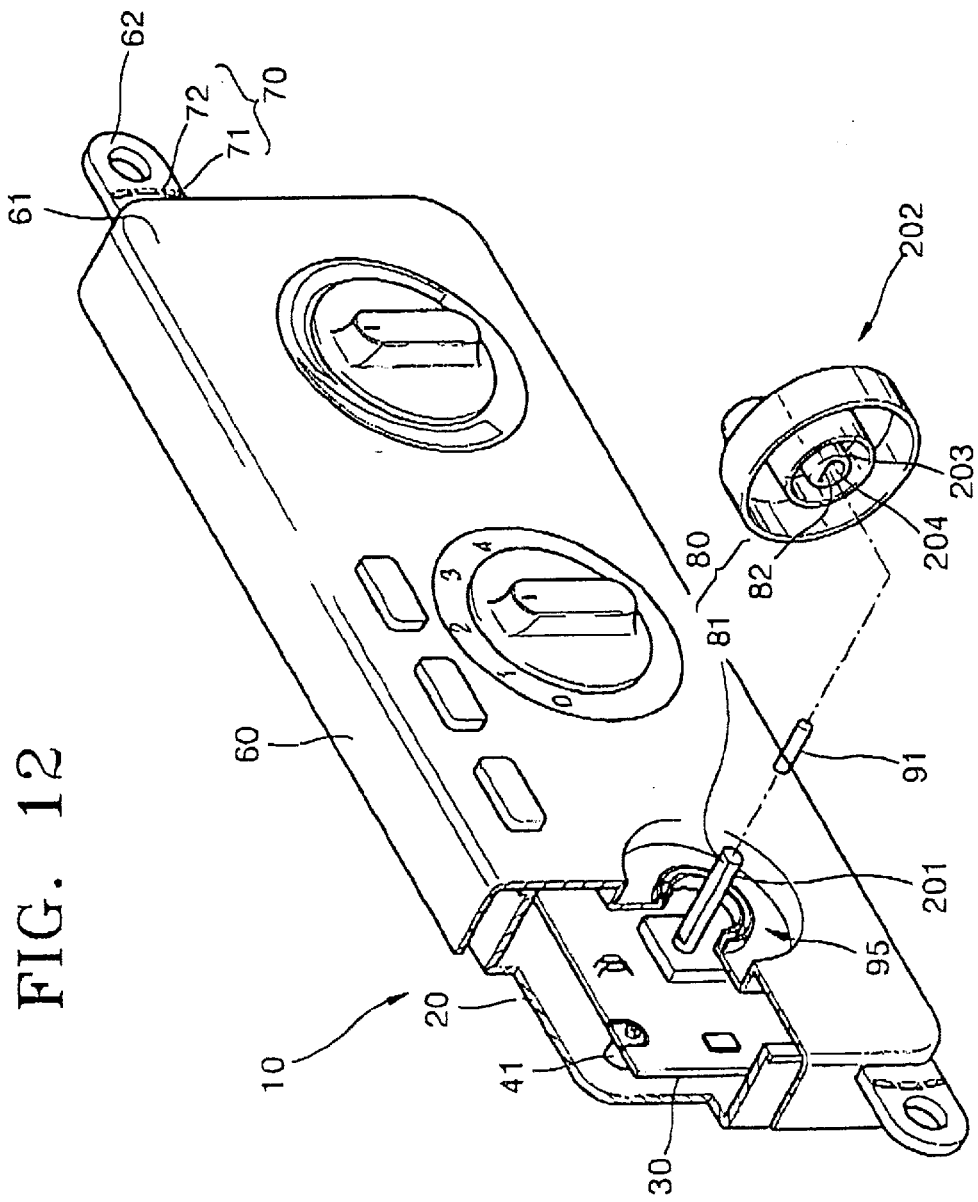
FIG. 12 is a partially cut-away perspective view showing yet another preferred embodiment of a mode switch assembly of an automobile having the impact/load absorbing apparatus of the present invention.
Figure 13:
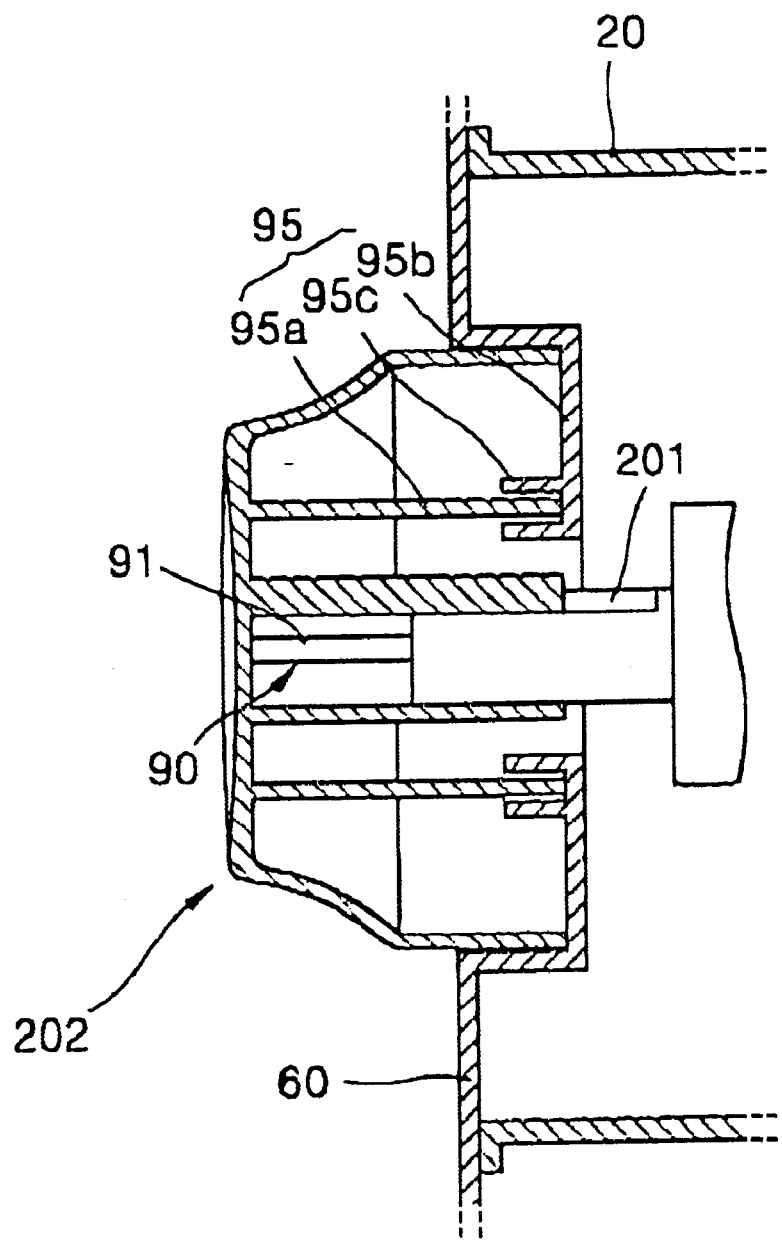
FIG. 13 is a sectional view of a mode switch assembly of an automobile having an impact/load absorbing apparatus shown in FIG. 12.

FIGS. 12 and 13 show yet another preferred embodiment of a mode switch assembly of an automobile having the impact/load absorbing apparatus of the present invention.

Referring to the drawings, a mode switch assembly according to yet another preferred embodiment of the present invention includes the housing 20 disposed in the center facia panel 100 inside the automobile, a circuit board 30 installed in the housing 20 where the switch having the shaft 201 is installed, and a control cover 60 coupled to the center facia panel 100 that the shaft 201 penetrates. One end portion of the shaft 201 is coupled to a hole 204 formed in a hub 203 of the knob 202 by a coupling unit to be capable of sliding. The coupling unit 80 may include a flat surface 81 formed on the outer circumference of the shaft 201 in the lengthwise direction and a rotation prevention portion 82 formed on the inner surface of the hole 204 of the hub 203 to contact the flat surface 81 of the shaft 201. Here, a spline may be formed on the outer circumferential surface of the shaft 201 and the inner circumferential surface of the hole 204. Preferably, the shaft 201 and the hub 203 are coupled such that they are not separated or slide without applying an external force.

An impact/load absorbing portion 90 for absorbing an impact/load applied to the knob 202 is installed between the bottom surface of the hole 204 formed in the hub 203 and the end portion of the shaft 201. The impact/load absorbing portion 90 may be an elastic member 91 disposed between the bottom surface of the hole 204 and the end portion of the shaft 201. The elastic member 91 is a bar formed of a rubber member having a diameter less than that of the shaft 201. The elastic member 91 may be a coil spring.

An elastic support portion 95 for elastically supporting the knob 202 and guiding reciprocation of the knob 202 is provided at the control cover 60 and the knob 202. The elastic support portion 95 includes a flange portion 95a circularly formed around the hub 203 on the inner circumferential surface of the knob 202, an inner flange portion 95b formed on the control cover 60 to extend toward the knob 202, and a guide portion 95c installed at the end portion of the inner flange portion 95b for guiding the end portion of the inner flange portion 95b. The elastic support portion 95 is not limited by the above-described preferred embodiment and any structure capable of elastically supporting the knob 202 can be adopted.

In the mode switch assembly of an automobile having the impact/load absorbing apparatus having the above structure, when an impact/load over a predetermined amount is applied to the knob 202, the knob 202 is moved along the shaft 201 by the impact/load. Accordingly, as the knob 202 presses the elastic member 91 located in the hole 204 of the hub 203, the elastic member 91 is bent. As the elastic member 91 is bent, the knob 202 is compressed and moved within a range satisfying the restrictions on the amount of protrusion of the knob. When the external force is removed, the knob 202 is returned to the original position by the elastic support portion 95 and the elastic member 91. The guide portion 95c formed at the end portion of the inner flange portion 95b of the control cover 60 is inserted into the inner flange portion 95b of the knob 202 and guides the knob 202 to stably move forward and backward and simultaneously support the knob 202 not to be pushed into the housing 20.

Then, the knob 202 is moved into the control cover 60 so as to be pushed into the center facia panel 100. Thus, an impact/load received by a passenger can be lowered. Since the impact/load absorbing portion 90 reduces damage by the knob 202 to other parts as an impact/load is absorbed by the bending of the elastic member 91 and the knob 202 returns to its original state after the impact/load is removed, the damage to the parts can be minimized.

As described above, in the mode switch assembly of an automobile having an impact/load absorbing apparatus according to the present invention, when an impact/load over a predetermined amount is applied to the knob, the connection portion of the impact/load absorbing apparatus formed at the circuit board, the housing, or the control cover is broken and the knob is moved. Thus, the impact/load is lowered and the damage to the passenger can be minimized. Also, parts can be prevented from being damaged by the impact/load applied to the knob.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A mode switch assembly of an automobile having an impact/load absorbing apparatus comprising:

a housing for mounting in a center facia panel in an automobile;

a circuit board installed in the housing and on which a switch having a shaft is installed;

a support portion for supporting the circuit board separated by a predetermined distance from the housing;

a knob installed on the shaft and protruding from the center facia panel; and an impact/load absorbing unit so the knob and the shaft retract with respect to the center facia panel, breaking part of at least one side of the circuit board or the housing, when an impact/load applied to the shaft through the knob.

2. The mode switch assembly as claimed in claim 1, wherein the impact/load absorbing unit has at least one notch so that the circuit board is broken by an impact/load applied from the knob and through the shaft.

3. The mode switch assembly as claimed in claim 1, wherein the impact/load absorbing unit has at least one slot so that the circuit board is broken by an impact/load applied from the knob and through the shaft.

4. The mode switch assembly as claimed in claim 1, wherein the impact/load absorbing unit has at least one groove so that the circuit board is broken by an impact/load applied from the knob and through the shaft.

5. The mode switch assembly as claimed in claim 1, wherein the support, portion comprises a plurality of bosses protruding from the housing and a plurality of coupling members fixing the circuit board to the bosses.

6. The mode switch assembly as claimed in claim 5, wherein the impact/load absorbing unit has a plurality of slots weakening the housing and positioned around each of the bosses so that the housing, around each of the bosses, is broken by an impact/load applied from the knob and through the shaft.

7. The mode switch assembly as claimed in claim 5, wherein the impact/load absorbing unit has a plurality of continuous slots positioned at a predetermined interval where the circuit board is coupled to the bosses.

8. The mode switch assembly as claimed in claim 1, wherein the impact/load absorbing unit has at least one notch or slot in the housing so that the housing is broken by an impact/load applied from the knob and through the shaft.

9. A mode switch assembly of an automobile having an impact/load absorbing apparatus comprising:

a housing for mounting in a center facia panel in an automobile;

a circuit board installed in the housing and on which a switch having a shaft is installed;

a control cover to which the housing is fixed and that the shaft penetrates, on which a mounting portion coupled to the center facia panel is located;

a knob installed at one end of the shaft, to protruding from the center facia panel; and an impact/load absorbing unit on at least one side of the control cover and the mounting portion so the knob retracts with respect to the center facia panel and is broken by an impact/load applied to the knob and the shaft.

10. The mode switch assembly as claimed in claim 9, wherein the impact/load absorbing unit has at least two slots located at the mounting portion and at least one connection portion broken by an impact/load and located between the slots.

11. The mode switch assembly as claimed in claim 9, wherein the impact/load absorbing unit has at least one notch at a boundary between the mounting portion and the control cover.

12. The mode switch assembly as claimed in claim 9, wherein the impact/load absorbing unit has at least one groove at a boundary between the mounting portion and the control cover.

13. The mode switch assembly as claimed in claim 9, wherein the impact/load absorbing unit has at least one groove in the control cover at a boundary between the housing and the control cover.

14. A mode switch assembly of an automobile having an impact/load absorbing apparatus comprising:

a housing for mounting in a center facia panel in an automobile;

a circuit board installed in the housing and on which a switch having a shaft is installed;

a control cover coupled to the center facia panel and that the shaft penetrates;

a knob having a hub that has a hole along which the shaft slides and a coupling unit coupling the shaft to the knob; and an impact/load absorbing unit installed between a bottom surface of the hole in the hub and an end of the shaft, absorbing an impact/load applied to the knob, so the knob retracts along the shaft.

15. The mode switch assembly as claimed in claim 14, wherein the impact/load absorbing unit includes an elastic member.

16. The mode switch assembly as claimed in claim 15, wherein the elastic member is one of a rubber member and a spring.

17. The mode switch assembly as claimed in claim 14, wherein the coupling unit comprises a flat surface and a rotation prevention portion on an outer circumferential surface of the shaft and an inner circumferential surface of the hole of the hub, respectively, in a lengthwise direction and coupled each other for sliding.

18. The mode switch assembly as claimed in claim 14, further comprising an elastic support unit elastically supporting the knob and guiding reciprocation of the knob at the control cover and the knob.

19. The mode switch assembly as claimed in claim 18, wherein the elastic support unit comprises:

a circular flange around the hub on an inner circumferential surface of the knob;

an inner flange extending an inner surface of the control cover toward the knob; and a guide at an end of the inner flange for guiding a portion of the inner flange.

20. A mode switch assembly of an automobile having an impact/load absorbing apparatus comprising:

a housing for mounting in a center facia panel in an automobile;

a circuit board installed in the housing and on which a switch having a shaft is installed;

a support portion for supporting the circuit board separated by a predetermined distance from the housing;

a control cover to which the housing is fixed and that the shaft penetrates, and on which a mounting portion coupled to the center facia panel is located;

a knob installed on the shaft and protruding from the center facia panel;

a first impact/load absorbing unit so the knob and the shaft retract with respect to the center facia panel, breaking at least one side of the housing or the circuit board, when an impact/load is applied to the shaft through the knob; and a second impact/load absorbing unit at at least one side of the control cover and the mounting portion so the knob retracts with respect to the center facia panel when an impact/load is applied to the knob and the shaft.

\* \* \* \* \*